(12) United States Patent
Huang et al.

(10) Patent No.: US 10,868,559 B1
(45) Date of Patent: Dec. 15, 2020

(54) READOUT METHOD, READOUT CIRCUIT AND SENSING APPARATUS WITH WIDE DYNAMIC RANGE

(71) Applicant: Taiwan Semiconductor Manufacturing Co., Ltd., Hsinchu (TW)

(72) Inventors: Yu-Jie Huang, Kaohsiung (TW); Jui-Cheng Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/744,185

(22) Filed: Jan. 16, 2020

(51) Int. Cl.
*H03M 1/46* (2006.01)
*H03M 1/18* (2006.01)
*H03M 1/74* (2006.01)

(52) U.S. Cl.
CPC .......... *H03M 1/462* (2013.01); *H03M 1/181* (2013.01); *H03M 1/74* (2013.01)

(58) Field of Classification Search
CPC ......... H03M 1/462; H03M 1/181; H03M 1/74
USPC ................................................ 341/155, 161
See application file for complete search history.

(56) References Cited

U.S. PATENT DOCUMENTS

| | | | | |
|---|---|---|---|---|
| 10,352,742 | B2 * | 7/2019 | Li | G01F 1/586 |
| 10,659,715 | B2 * | 5/2020 | Endsley | H04N 5/378 |
| 10,680,021 | B2 * | 6/2020 | Jacob | H04N 5/32 |
| 10,698,009 | B2 * | 6/2020 | Raman | G01R 33/07 |

* cited by examiner

*Primary Examiner* — Brian K Young
(74) *Attorney, Agent, or Firm* — JCIPRNET

(57) ABSTRACT

A readout circuit that includes an amplifier circuitry, an analog-to-digital converter, a feedback circuit and a control logic is introduced. The amplifier circuitry may receive and amplify a differential signal that is obtained according to an input signal and a feedback signal to generate an amplified signal. The analog-to-digital converter is configured to convert the amplified signal to generate a n-bit digital code, wherein n is a positive integer. The feedback circuit is configured to search and generate a m-bit digital code based on a value of the n-bit digital code and convert the m-bit digital code to generate the feedback signal, wherein m is a positive integer. The control logic is coupled to the analog-to-digital converter and the feedback circuit, and configured to control the analog-to-digital converter and the feedback circuit. A multi-bit digital output of the readout circuit is generated according to the n-bit digital code and the m-bit digital code.

20 Claims, 3 Drawing Sheets

READOUT METHOD, READOUT CIRCUIT AND SENSING APPARATUS WITH WIDE DYNAMIC RANGE

BACKGROUND

In a sensor system, a detection resolution and a detectable range are two critical parameters that influence to performance the sensing system. However, there is a trade-off between the detection resolution and the detectable range. For example, a sensing system with high detection resolution would have narrow detectable range, and a sensing system with high detection range would have low detection resolution. Some sensing systems use a tunable amplifier with a moderate analog-to-digital converter (ADC) to realize a wide detectable range. However, these sensing systems can only be used for either a wide-range and low amplification gain detection or a narrow range and high amplification gain detection. Some alternative sensing systems use a high-resolution ADC, such as sigma-delta ADC, to achieve wide dynamic range detection. However, the sensing systems with high-resolution ADC suffers from low-speed data rate and complex implementation.

As demand for a sensing apparatus with a wide dynamic range and having a simple and small-in-size ADC has grown recently, it has a grown need for a more creative design methodology for sensing apparatus and a readout circuit of the sensing apparatus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
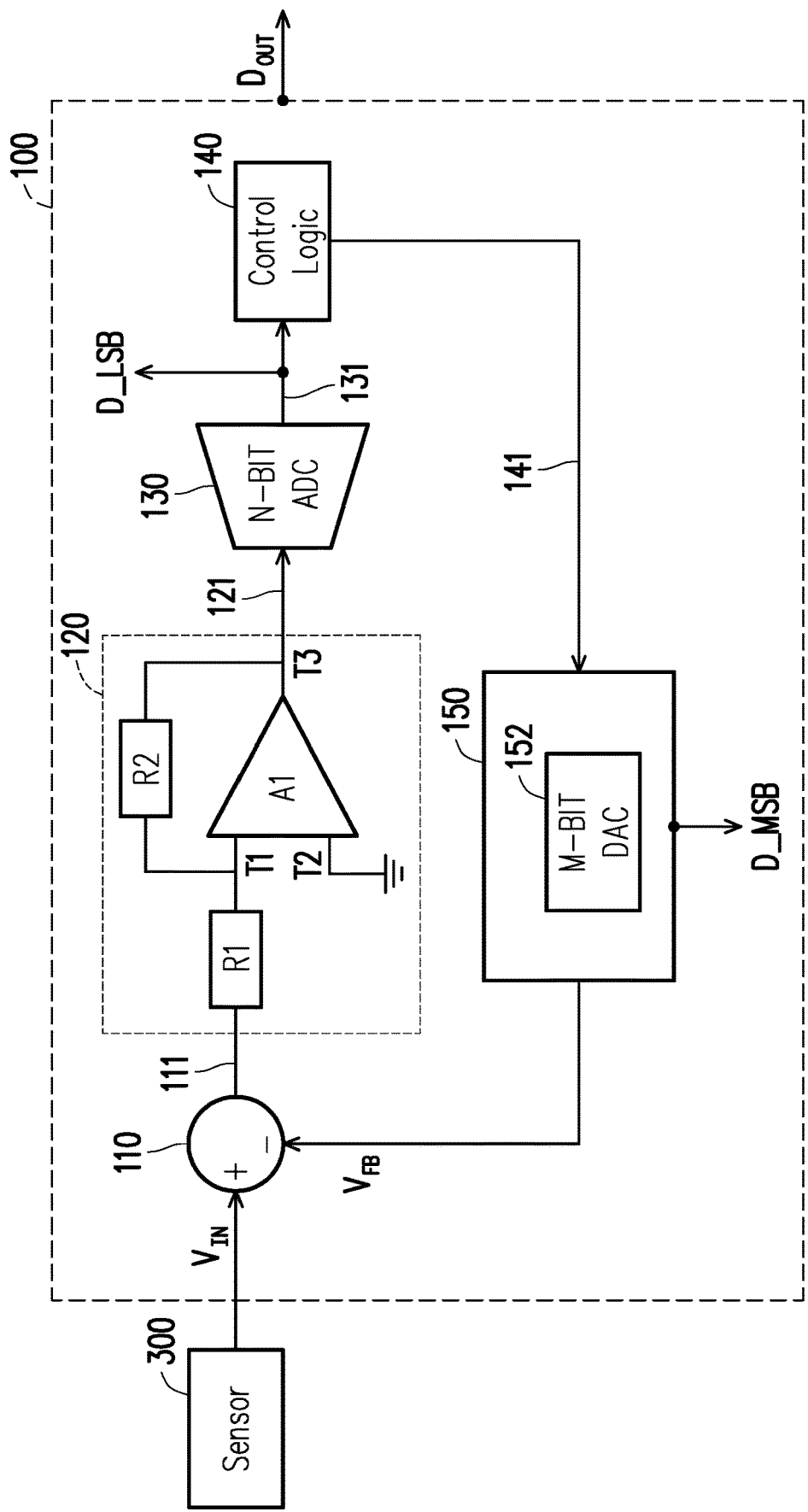
FIG. 1 is a schematic diagram illustrating a sensing apparatus in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram illustrating a sensing apparatus that includes a sensor 300 and a readout circuit 100 in accordance with some embodiments. The sensor 300 is configured to detect an event and convert the detection of the event into a measurable signal such as an electrical signal, an optical signal, or a wireless signal. In some embodiments, the sensor 300 may be or may include a biological sensor that is configured to detect a biological agent or a target analyte and convert the detection into an electrical signal (e.g., a voltage signal or a current signal). For example, the sensor 300 as shown in FIG. 1 may generate a signal $V_{IN}$ and provide the signal $V_{IN}$ to the readout circuit 100.

The readout circuit 100 is coupled to the sensor 300 to receive the signal $V_{IN}$ and is configured to generate a multi-bit digital output $D_{OUT}$ based on the signal $V_{IN}$. In some embodiments, the readout circuit 100 may include a differential circuit 110, an amplifier circuitry 120, an analog-to-digital converter (ADC) 130, a control logic 140 and a feedback circuit 150. The differential circuit 110 may calculate a difference between an input signal $V_{IN}$ a feedback signal $V_{FB}$ to generate a differential signal 111, in which the feedback signal $V_{FB}$ is generated by the feedback circuit 150.

The amplifier circuitry 120 is coupled to the differential circuit 110, and is configured to amplify the differential signal 111 with an amplification gain to generate an amplified signal 121. The amplifier circuitry 120 may include resistors R1 and R2 and an amplifier A1. The amplifier A1 may have input terminals T1 and T2 and an output terminal T3, in which the input terminal T1 is coupled to the differential circuit 110 through the resistor R1; the input terminal T2 is coupled to a reference node (e.g., ground node). The output terminal T3 is configured to output the amplified signal 121. The resistor R2 may by coupled to the amplifier A1 in parallel. More particularly, the resistor R2 is coupled between the input terminal T1 and the output terminal T3 of the amplifier A1. In some embodiments, the amplifier circuitry 120 may amplify the differential signal 111 with a fixed amplification gain to generate an amplified signal 121, but the disclosure is not limited thereto.

In some embodiments, the amplifier circuitry 120 may amplify the differential signal 111 while minimizing additional noises, thereby achieving a low-noise amplifier circuit. The components included in the amplifier circuitry 120 and electrical connections of these components are designed such that the noise is minimized. In some embodiments, the amplifier circuitry 120 is further configured to have a high amplification gain. For example, the amplification gain of the amplifier circuitry 120 may be 2000V/V or higher, but the disclosure is not limited thereto.

The ADC 130 is coupled to the amplifier circuitry 120 and is configured to convert the amplified signal 121 to a digital code 131, in which the digital code 131 may be considered as a digital representation of the analog amplified signal 121. In some embodiments, the ADC 130 is a moderate ADC having a resolution of n-bits and is configured to convert the amplified signal 121 to generate a n-bit digital code 131, where n is a positive integer. The n-bit digital code 131 may be outputted as a digital code D_LSB that is used to generate the multi-bit digital output DOUT. In some embodiments, the digital code D_LSB is combined with another digital code to generate the multi-bit digital output $D_{OUT}$, in which digital code D_LSB may include the least-significant-bit (LSB) of the multi-bit digital output $D_{OUT}$. In other words, the digital code D_LSB may be n least significant bits (e.g., n-bits that is closest to, and including, the LSB).

The control logic 140 may be coupled to the ADC 130 to control an operation of the ADC 130 to generate the n-bit digital code 131 from the amplified signal. In an example, the ADC 130 may be or may include a successive approximation resister (SAR) ADC; and the control logic 140 may include a comparator and logic circuits that cooperate with the SAR ADC 130 to generate the n-bit digital code 131 from the amplified signal 121.

In some embodiments, the feedback circuit 150 is coupled to the control logic 140 and the differential circuit 110. An operation of the feedback circuit 150 may be controlled by the control logic 140 through a signal 141, and a feedback signal $V_{FB}$ that is generated by the feedback circuit 150 is provided to the differential amplifier 110.

The feedback circuit 150 may generate a m-bit digital code D_MSB based on the input signal $V_{IN}$, in which m is a positive integer. The m-bit digital code D_MSB may be combined with another digital code (e.g., n-bit digital code D_LSB) to generate the multi-bit digital output $D_{OUT}$. In some embodiments, the m-bit digital code D_MSB may be m most significant bits (e.g., m-bits that is closest to, and including, the MSB).

In some embodiments, the feedback circuit 150 may further include a digital-to-analog converter (DAC) 152 that is configured to convert the m-bit digital code D_MSB to the feedback signal $V_{FB}$. In other words, the feedback signal $V_{FB}$ may be an analog representation of the m-bit digital code D_MSB. The feedback signal $V_{FB}$ is provided to the differential circuit 110.

In some embodiments, the readout circuit 100 may generate the multi-bit digital output $D_{OUT}$ based on the m-bit digital code D_MSB generated by the feedback circuit 150 and the n-bit digital code D_LSB generated by the ADC 130. The readout circuit 100 may combine the m-bit digital code D_MSB with the n-bit digital code D_LSB to generate the multi-bit digital output $D_{OUT}$. In some embodiments, the m-bit digital code D_MSB is combined with the n-bit digital code D_LSB to generate the multi-bit digital output $D_{OUT}$ that has a resolution of (m+n) bits, in which the n-bit digital code D_LSB are the least significant bits of the multi-bit digital output $D_{OUT}$, and the m-bit digital code D_MSB are the most significant bits of the multi-bit digital output $D_{OUT}$. In some embodiments, the control logic 140 may combine the m-bit digital code D_MSB with the n-bit digital code D_LSB to generate the multi-bit digital output $D_{OUT}$, but the disclosure is not limited thereto. The readout circuit 100 may include a logic circuit that is configured to combine the m-bit digital code D_MSB with the n-bit digital code D_LSB to generate the multi-bit digital output $D_{OUT}$.

In some embodiments, the ADC 130 may be or may include a 6-bit ADC that is configured to generate the 6-bit digital code; and the feedback circuit 150 may generate the 11-bit digital code D_MSB. As such, the readout circuit 100 may generate a 17-bit digital output $D_{OUT}$ based on the 11-bit digital code D_MSB and the 6-bit digital code D_LSB. It is noted that a single ADC or DAC with the resolution of 17 bits is much bigger in size, much more complicated and much slower than a combination of moderate ADC and DAC (e.g., 6-bit ADC and 11-bit DAC). As such, the readout circuit 100 that uses simple and moderate resolution ADC and DAC may achieve a wide dynamic range while achieving fast operation and occupying small layout area.

Figure 2:
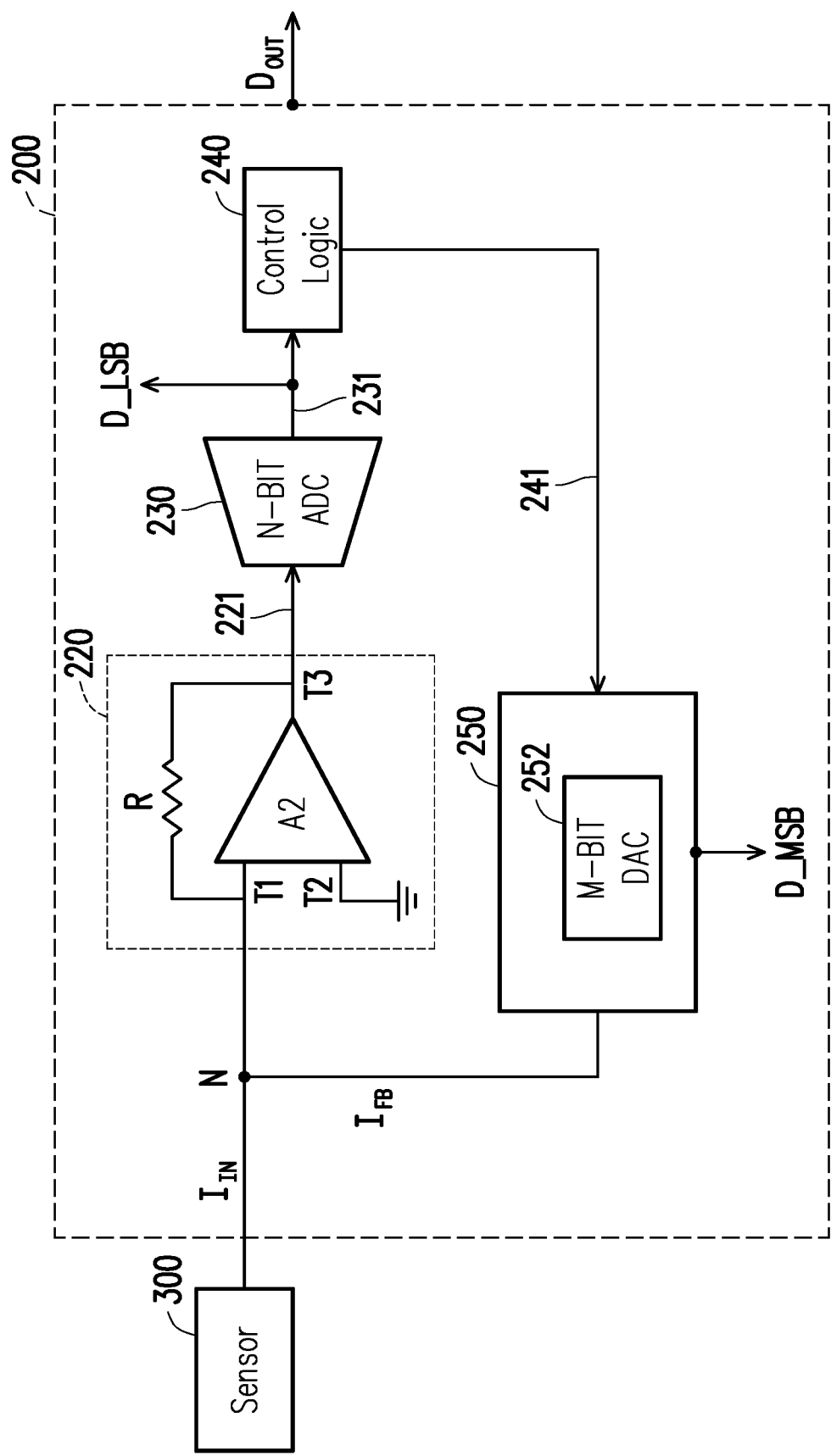
FIG. 2 is a schematic diagram illustrating a sensing apparatus in accordance with some alternative embodiments.

Referring to FIG. 2, a schematic diagram of a sensing apparatus that includes a sensor 300 and a readout circuit 200 is illustrated in accordance with some embodiments. A structure and function of the sensor 300 as shown in FIG. 2 are similar to the sensor 300 as shown in FIG. 1. A difference between the sensor 300 shown in FIG. 1 and the sensor 300 shown in FIG. 2 is that the signal $I_{IN}$ generated by the sensor 300 in FIG. 2 is a current signal instead of a voltage signal.

The readout circuit 200 is coupled to the sensor 300 to receive the signal $I_{IN}$ and is configured to generate a multi-bit digital output $D_{OUT}$ based on the received signal $I_{IN}$. The readout circuit 200 may include an amplifier circuitry 220, an ADC 230, a control logic 240, and a feedback circuit 250. In some embodiments, the sensor 300, the feedback circuit 250 and the amplifier circuitry 220 are coupled to each other through a connection node N. A differential signal that is obtained based on a difference between feedback signal $I_{FB}$ and the input signal $I_{IN}$ is generated at the connection node N. In some embodiments, the differential signal at the connection node N may be a current signal indicating a difference between the input signal $I_{IN}$ and the feedback signal $I_{FB}$.

The amplifier circuitry 220 may receive the differential signal from the connection node N, and is configured to amplify the received differential signal to generate an amplified signal 221. In some embodiments, the amplifier circuitry 220 may include a resistor R and an amplifier A2. The amplifier A2 may have input terminals T1 and T2 and an output terminal T3, in which the input terminal T1 is coupled to the connection node N; the input terminal T2 is coupled to a reference node (e.g., ground); and the output terminal T3 is configured to output the amplified signal 221. The resistor R may be coupled to the amplifier A2 in parallel, in which the resistor R is coupled between the input terminal T2 and the output terminal T3 of the amplifier A2. In some embodiments, the amplifier circuitry 220 may amplify the received differential signal with a fixed amplification gain to generate the amplified signal 221, but the disclosure is not limited thereto.

In some embodiments, the amplifier circuitry 220 may be a low-noise and high-gain amplifier circuit, in which the components included in the amplifier circuitry 220 and electrical connections of these components are designed such that the noise is minimized and the amplification gain is relatively high. In some embodiments, the amplifier circuitry 220 may include a low-noise and high-gain transimpedance amplifier (TIA) that may have the amplification gain of 4GΩ or higher, but the disclosure is not limited thereto.

The ADC 230 is coupled to the amplifier circuit 220 to receive the amplified signal 221, and is configured to convert the amplified signal 221 to a n-bit digital code 231 (or a digital code D_LSB). In other words, the n-bit digital code 231 is a digital representation of the amplified signal 221. The digital code D_LSB may be used to generate the multi-bit digital output $D_{OUT}$, in which the digital code D_LSB may be n least significant bits (e.g., n-bits that is closest to, and including, the LSB) of the multi-bit digital output $D_{OUT}$.

The control logic 240 is coupled to the ADC 230 to control the operation of the ADC 230 to generate the n-bit digital code 231. In an example, the ADC 130 may be or may include a successive approximation resister (SAR) ADC; and the control logic 240 may include a comparator and logic circuits that cooperate with the SAR ADC 230 to generate the n-bit digital code 231 from the amplified signal 221.

In some embodiments, the feedback circuit 250 may generate a m-bit digital code D_MSB based on the input signal $I_{IN}$. The control logic 240 may be coupled to the feedback circuit 250 to control the operations of the m-bit digital code D_MSB through the signal 241. In some embodiments, the m-bit digital code D_MSB may be combined with another digital code (e.g., n-bit digital code D_LSB) to generate the multi-bit digital output $D_{OUT}$. In some embodiments, the m-bit digital code D_MSB may be m most significant bits (e.g., m-bits that is closest to, and including, the MSB).

In some embodiments, the feedback circuit 250 may further include a DAC 252 that is configured to convert the m-bit digital code D_MSB to generate the feedback signal $I_{FB}$. In other words, the feedback signal $I_{FB}$ is an analog representation of the m-bit digital code D_MSB. The feedback signal $V_{FB}$ is provided to the connection node N.

In some embodiments, the readout circuit 200 may combine the m-bit digital code D_MSB with the n-bit digital code D_LSB to generate the multi-bit digital output DOUT. For example, the m-bit digital code D_MSB is combined with the n-bit digital code D_LSB to generate the multi-bit digital output $D_{OUT}$ that has a resolution of (m+n) bits, in which the n-bit digital code D_LSB are the least significant bits of the multi-bit digital output $D_{OUT}$, and the m-bit digital code D_MSB are the most significant bits of the multi-bit digital output $D_{OUT}$. In some embodiments, the control logic 240 may combine the m-bit digital code D_MSB with the n-bit digital code D_LSB to generate the multi-bit digital output $D_{OUT}$, but the disclosure is not limited thereto. The readout circuit 200 may include a logic circuit that is configured to combine the m-bit digital code D_MSB with the n-bit digital code D_LSB to generate the multi-bit digital output $D_{OUT}$.

In some embodiments, the ADC 230 may be or may include a 6-bit ADC that is configured to generate the 6-bit digital code; and the feedback circuit 250 may generate the 11-bit digital code D_MSB. As such, the readout circuit 200 may generate a 17-bit digital output $D_{OUT}$ based on the 11-bit digital code D_MSB and the 6-bit digital code D_LSB. It is noted that a single ADC or DAC with the resolution of 17 bits is much bigger in size, much more complicated and much slower than a combination of moderate ADC and DAC (e.g., 6-bit ADC and 11-bit DAC). As such, the readout circuit 200 that uses simple and moderate resolution ADC and DAC may achieve a wide dynamic range while achieving fast operation and occupying small layout area.

Figure 3:
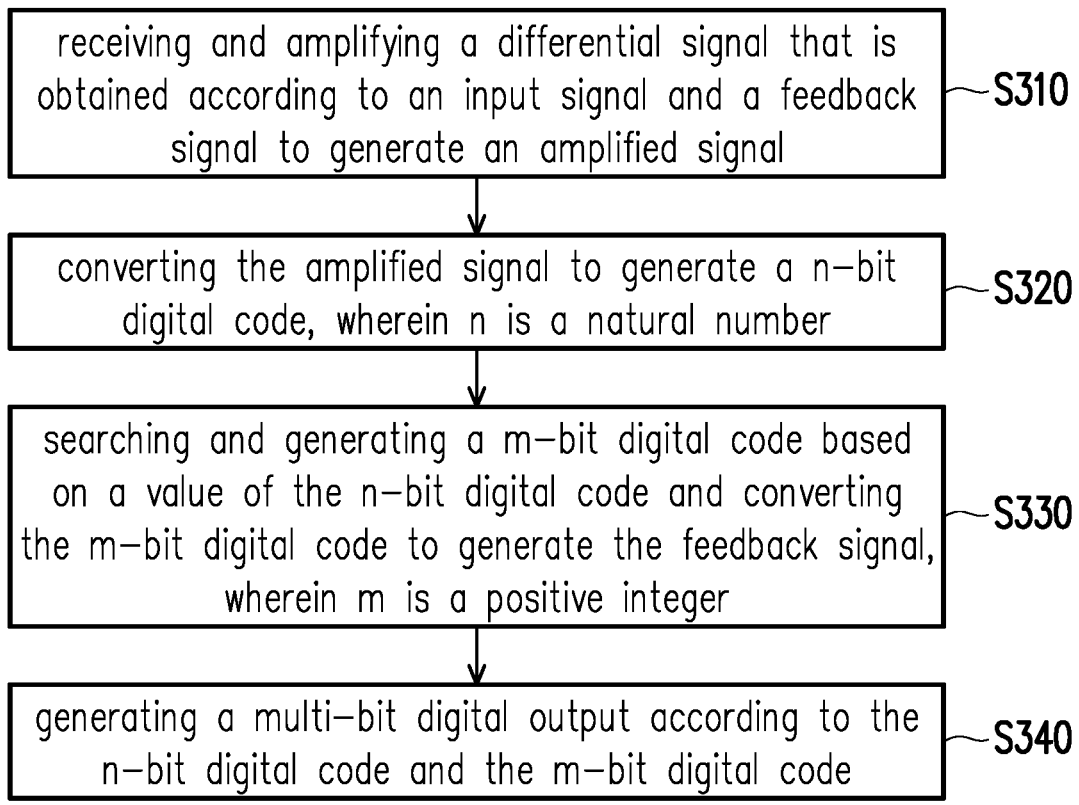
FIG. 3 is a flowchart diagram illustrating a readout method in accordance with some embodiments.

Referring to FIG. 3, a flowchart diagram illustrating steps of a readout method in accordance with some embodiments. In step S310, a differential signal that is obtained according to an input signal and a feedback signal is amplified to generate an amplified signal. In some embodiments, the differential signal is generated based on a difference between the input signal and the feedback signal. In step S320, the amplified signal is converted to a n-bit digital code, wherein n is a positive integer. In some embodiments, the n-bit digital code is a digital representation of the amplified signal. In step S330, a m-bit digital code is iteratively searched, for example, through binary-search method or direct-counting method, and generated based on the value of n-bit digital code and the m-bit digital code is converted to generate the feedback signal, wherein m is a positive integer. In some embodiments, the feedback signal is an analog representation of the m-bit digital code. In step S340, a multi-bit digital output is generated according to the n-bit digital code and the m-bit digital code. In some embodiments, the n-bit digital code is combined with the m-bit digital code to generate the multi-bit digital output, where the n-bit digital code includes least significant bits of the multi-bit digital output and m-bit digital code includes most significant bits of the multi-bit digital output.

In accordance with some embodiments, the sensing apparatus with a combination of moderate ADC and DAC may achieve a wide dynamic range without sacrificing amplification range and the sensitivity. For example, a combination of a m-bit DAC in the feedback circuit and a n-bit ADC may output a high detective resolution of (m+n) bits, thereby improving the dynamic range of the sensing apparatus. In addition, since the moderate ADC and DAC are used instead of highly complex ADC and DAC, the speed of the sensing apparatus is improved and the occupied area of the sensing apparatus is reduced.

In some embodiments, a readout circuit may include an amplifier circuitry, an analog-to-digital converter, a feedback circuit and a control logic. The amplifier circuitry is configured to receive and amplify a differential signal that is obtained according to an input signal and a feedback signal to generate an amplified signal. The analog-to-digital converter is coupled to the amplifier circuitry and is configured to convert the amplified signal to generate a n-bit digital code, wherein n is a positive integer. The feedback circuit is configured to generate a m-bit digital code based on the input signal and convert the m-bit digital code to generate the feedback signal, wherein m is a positive integer. The control logic is coupled to the analog-to-digital converter and the feedback circuit, and configured to control the analog-to-digital converter and the feedback circuit. A multi-bit digital output of the readout circuit is generated according to the n-bit digital code and the m-bit digital code.

In some embodiments, a sensing apparatus that includes a sensor and a readout circuit is introduced. The sensor is configured to generate an input signal. The readout circuit may include an amplifier circuitry, an analog-to-digital converter, a feedback circuit and a control logic. The amplifier circuitry is configured to receive and amplify a differential signal that is obtained according to an input signal and a feedback signal to generate an amplified signal. The analog-to-digital converter is coupled to the amplifier circuitry is configured to convert the amplified signal to generate a n-bit digital code, wherein n is a positive integer. The feedback circuit is configured to generate a m-bit digital code based on the input signal and convert the m-bit digital code to generate the feedback signal, wherein m is a positive integer. The control logic is coupled to the analog-to-digital converter and the feedback circuit, and configured to control the analog-to-digital converter and the feedback circuit. A multi-bit digital output of the readout circuit is generated according to the n-bit digital code and the m-bit digital code.

In some embodiments, a readout circuit includes steps of receiving and amplifying a differential signal that is obtained according to an input signal and a feedback signal to generate an amplified signal; converting the amplified signal to generate a n-bit digital code, wherein n is a positive integer; generating a m-bit digital code based on the input signal and converting the m-bit digital code to generate the feedback signal, wherein m is a positive integer; and generating a multi-bit digital output according to the n-bit digital code and the m-bit digital code.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A readout circuit, comprising:
   an amplifier circuitry, configured to receive and amplify a differential signal that is obtained according to an input signal and a feedback signal to generate an amplified signal;
   an analog-to-digital converter, coupled to the amplifier circuitry, configured to convert the amplified signal to generate a n-bit digital code, wherein n is a positive integer;
   a feedback circuit, configured to search and generate a m-bit digital code based on a value of the n-bit digital code and convert the m-bit digital code to generate the feedback signal, wherein m is a positive integer; and
   a control logic, coupled to the analog-to-digital converter and the feedback circuit, and configured to control the analog-to-digital converter and the feedback circuit, wherein the n-bit digital code is combined with the m-bit digital code to generate a multi-bit digital output of the readout circuit.

2. The readout circuit of claim 1, wherein
   the m-bit digital code comprises a most-significant-bit of the multi-bit digital output; and
   the n-bit digital code comprises a least-significant-bit of the multi-bit digital output.

3. The readout circuit of claim 1, wherein the feedback circuit comprises:
   a digital-to-analog converter, configured to convert the m-bit digital code to generate the feedback signal.

4. The readout circuit of claim 1, further comprising:
   a differential circuit, coupled to the feedback circuit, configured to calculate a difference between the input signal and the feedback signal to generate the differential signal.

5. The readout circuit of claim 4, wherein
   the digital-to-analog converter is a successive approximation resister digital-to-analog converter; and
   the analog-to-digital converter is a successive approximation resister analog-to-digital converter.

6. The readout circuit of claim 4, wherein
   the input signal and the feedback signal are voltage signals, and
   the amplifier circuitry comprises:
      a first resistor, coupled to the differential circuit;
      an amplifier, having a first input terminal and a second input terminal, wherein the first input terminal is coupled to the first resistor, and the second input terminal is coupled to a reference node; and
      a second resistor, coupled to the amplifier in parallel, wherein the second resistor is coupled between the first input terminal and an output terminal of the amplifier.

7. The readout circuit of claim 1, wherein
   the input signal and the feedback signal are current signals, and
   the amplifier circuitry comprises:
      an amplifier, having a first input terminal and a second input terminal, wherein the first input terminal is configured to receive the differential signal, and the second input terminal is coupled to a reference node; and
      a resistor, coupled to the amplifier in parallel, wherein the resistor is coupled between the first input terminal and an output terminal of the amplifier.

8. The readout circuit of claim 1, wherein the amplifier circuitry is configured to amplify the differential signal with a fixed amplification gain to generate the amplified signal.

9. A sensing apparatus, comprising:
   a sensor, configured to generate an input signal;
   a readout circuit, coupled to the sensor to receive the input signal, configured to search and generate a multi-bit digital output based on the input signal, wherein the readout circuit comprises:
      an amplifier circuitry, configured to receive and amplify a differential signal that is obtained according to the input signal and a feedback signal to generate an amplified signal;
      an analog-to-digital converter, coupled to the amplifier circuitry, configured to convert the amplified signal to generate a n-bit digital code, wherein n is a positive integer;
      a feedback circuit, configured to search and generate a m-bit digital code based on a value of the n-bit digital code and convert the m-bit digital code to generate the feedback signal, wherein m is a positive integer; and
      a control logic, coupled to the analog-to-digital converter and the feedback circuit, and configured to control the analog-to-digital converter and the feedback circuit, wherein the n-bit digital code is combined with the m-bit digital code to generate the multi-bit digital output.

10. The sensing apparatus of claim 9, wherein
    the m-bit digital code comprises a most-significant-bit of the multi-bit digital output; and
    the n-bit digital code comprises a least-significant-bit of the multi-bit digital output.

11. The sensing apparatus of claim 9, wherein the feedback circuit comprises:
    a digital-to-analog converter, configured to convert the m-bit digital code to generate the feedback signal.

12. The sensing apparatus of claim 9, wherein the readout circuit further comprises:
    a differential circuit, coupled to the feedback circuit, configured to calculate a difference between the input signal and the feedback signal to generate the differential signal.

13. The sensing apparatus of claim 12, wherein
    the digital-to-analog converter is a successive approximation resister digital-to-analog converter; and
    the analog-to-digital converter is a successive approximation resister analog-to-digital converter.

14. The sensing apparatus of claim 12, wherein
    the input signal and the feedback signal are voltage signals, and
    the amplifier circuitry comprises:
       a first resistor, coupled to the differential circuit;
       an amplifier, having a first input terminal and a second input terminal, wherein the first input terminal is coupled to the first resistor, and the second input terminal is coupled to a reference node; and a second resistor, coupled to the amplifier in parallel, wherein the second resistor is coupled between the first input terminal and an output terminal of the amplifier.

15. The sensing apparatus of claim 9, wherein the input signal and the feedback signal are current signals, and the amplifier circuitry comprises:

an amplifier, having a first input terminal and a second input terminal, wherein the first input terminal is configured to receive the differential signal, and the second input terminal is coupled to a reference node; and a resistor, coupled to the amplifier in parallel, wherein the resistor is coupled between the first input terminal and an output terminal of the amplifier.

16. The sensing apparatus of claim 9, wherein the amplifier circuitry is configured to amplify the differential signal with a fixed amplification gain to generate the amplified signal.

17. A readout method, comprising:

receiving and amplifying a differential signal that is obtained according to an input signal and a feedback signal to generate an amplified signal;

converting the amplified signal to generate a n-bit digital code, wherein n is a positive integer;

searching and generating a m-bit digital code based on a value of the n-bit digital code and converting the m-bit digital code to generate the feedback signal, wherein m is a positive integer; and combining the n-bit digital code with the m-bit digital code to generate a multi-bit digital output.

18. The readout method of claim 17, wherein the m-bit digital code comprises a most-significant-bit of the multi-bit digital output, and the n-bit digital code comprises a least-significant-bit of the multi-bit digital output.

19. The readout method of claim 17, wherein the differential signal is amplified with a fixed amplification gain to generate the amplified signal.

20. The readout method of claim 17, wherein the input signal and the feedback signal are voltage signals or current signals.

* * * * *